(12) United States Patent
Park et al.

(10) Patent No.: US 10,483,433 B2
(45) Date of Patent: Nov. 19, 2019

(54) ULTRAVIOLET LIGHT EMITTING DEVICES

(71) Applicant: Samsung Electronics Co., Ltd., Suwon-si (KR)

(72) Inventors: Young Hwan Park, Yongin-si (KR); Joo Sung Kim, Seongnam-si (KR); Young Jo Tak, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/051,684

(22) Filed: Aug. 1, 2018

(65) Prior Publication Data

US 2019/0189846 A1    Jun. 20, 2019

(30) Foreign Application Priority Data

Dec. 19, 2017    (KR) .......................... 10-2017-0175150

(51) Int. Cl.
| | |
|---|---|
| *H01L 33/20* | (2010.01) |
| *H01L 33/32* | (2010.01) |
| *H01L 33/14* | (2010.01) |
| *H01L 33/06* | (2010.01) |
| *H01L 33/00* | (2010.01) |
| *H01L 33/44* | (2010.01) |
| *H01L 33/40* | (2010.01) |

(52) U.S. Cl.
CPC ............ *H01L 33/20* (2013.01); *H01L 33/007* (2013.01); *H01L 33/0075* (2013.01); *H01L 33/06* (2013.01); *H01L 33/145* (2013.01); *H01L 33/32* (2013.01); *H01L 33/44* (2013.01); *H01L 33/40* (2013.01); *H01L 2933/0016* (2013.01); *H01L 2933/0025* (2013.01)

(58) Field of Classification Search
CPC ..... H01L 33/22; H01L 33/20; H01L 33/0075; H01L 33/007; H01L 33/025
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |

(Continued)

FOREIGN PATENT DOCUMENTS

JP    2006-332234 A    12/2006

*Primary Examiner* — Frederick B Hargrove
(74) *Attorney, Agent, or Firm* — Muir Patent Law, PLLC

(57) ABSTRACT

An embodiment of the present inventive concept provides an ultraviolet light emitting device comprising: a substrate having a concave or convex edge pattern disposed along an edge of an upper surface thereof; a semiconductor laminate disposed on the substrate and including first and second conductivity-type AlGaN semiconductor layers and an active layer disposed between the first and second conductivity-type AlGaN semiconductor layers and having an AlGaN semiconductor; a plurality of uneven portions extending from the edge pattern along the side surface of the semiconductor laminate in a stacking direction; and first and second electrodes connected to the first and second conductivity-type AlGaN semiconductor layers, respectively.

20 Claims, 8 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 6/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,304,800 B2 | 11/2012 | Beom et al. |
| 8,324,646 B2 | 12/2012 | Lee et al. |
| 8,399,944 B2 | 3/2013 | Kwak et al. |
| 8,432,511 B2 | 4/2013 | Jeong |
| 8,455,906 B2 | 6/2013 | Kim et al. |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,916,904 B2 | 12/2014 | Shinohara et al. |
| 2009/0278140 A1 | 11/2009 | Huang et al. |
| 2012/0187370 A1* | 7/2012 | Jeong .............. H01L 33/486 257/13 |
| 2012/0261702 A1* | 10/2012 | Su .............. H01L 33/007 257/98 |
| 2014/0117395 A1* | 5/2014 | Kim .............. H01L 33/20 257/98 |
| 2015/0270441 A1 | 9/2015 | Kim et al. |
| 2016/0056352 A1* | 2/2016 | Koike .............. H01L 33/22 257/98 |
| 2016/0225942 A1* | 8/2016 | Aota .............. H01L 33/22 |
| 2016/0240739 A1 | 8/2016 | Shatalov et al. |

\* cited by examiner

ULTRAVIOLET LIGHT EMITTING DEVICES

CROSS-REFERENCE TO RELATED APPLICATION

This application claims benefit of priority to Korean Patent Application No. 10-2017-0175150 filed on Dec. 19, 2017 in the Korean Intellectual Property Office, the disclosure of which is incorporated herein by reference in its entirety.

BACKGROUND

Field

The present disclosure relates to an ultraviolet light emitting device.

Description of Related Art

Recently, ultraviolet light sources have been employed for various purposes in devices such as sterilizers, disinfection devices, UV curing devices and the like. As ultraviolet light sources, environmentally friendly semiconductor light-emitting diodes (LED) having high efficiency characteristics have received considerable attention. For example, nitride semiconductor light-emitting diodes have been used.

However, in the case of UV nitride semiconductor LEDs, the external quantum efficiency thereof may be degraded because of Auger recombination due to crystal defects and a low carrier concentration (particularly, in the case of holes), and they may be configured of highly refractive semiconductors, thereby resulting in low light extraction efficiency. For example, in the case of nitride semiconductor LEDs for a short-wavelength region (for example, UV-B and UV-C) in an ultraviolet band, since light extraction efficiency may be extremely low (for example, 2% to 3%), the commercialization of nitride semiconductor LEDs may be difficult. This low efficiency is due to the fact that light generated in an $Al_xGa_{1-x}N$ quantum well has more components of light traveling in a lateral direction than in a vertical direction of a device, as compared to light generated in a normal $In_xGa_{1-x}N$ quantum well, and the light traveling in the lateral direction is highly likely to be reabsorbed by another semiconductor layer such as an active layer or a substrate.

SUMMARY

Example embodiments provide an ultraviolet light emitting device having improved light extraction efficiency.

According to an example embodiment, an ultraviolet light emitting device includes: a substrate provided with an edge pattern at an upper surface thereof at a side edge of the substrate, the edge pattern having a concave or convex shape with respect to the upper surface of the substrate; a semiconductor laminate disposed on the substrate and on the edge pattern and including first and second conductivity-type AlGaN semiconductor layers and an active layer disposed between the first and second conductivity-type AlGaN semiconductor layers and having an AlGaN semiconductor; a plurality of uneven portions extending from the edge pattern along side surfaces of the semiconductor laminate in a stacking direction of the semiconductor laminate; and first and second electrodes connected to the first and second conductivity-type AlGaN semiconductor layers, respectively.

According to an example embodiment, an ultraviolet light emitting device includes: a substrate provided with a concave or convex edge pattern at side edges of an upper surface thereof, wherein an inner region excluding the side edges in the upper surface of the substrate has a flat surface; a semiconductor laminate including a first conductivity-type AlGaN semiconductor layer, an active layer having an AlGaN quantum well, and a second conductivity-type AlGaN semiconductor layer that are sequentially disposed on the upper surface of the substrate and on the edge pattern; and a plurality of cleavages extending from the edge pattern along a side surface of the semiconductor laminate in a stacking direction of the semiconductor laminate and having shapes of non-uniform lines.

According to an example embodiment, an ultraviolet light emitting device includes: a substrate having a rectangular parallelepiped structure and provided with an edge pattern disposed at at least one side edge of an upper surface thereof, wherein a region excluding the edge pattern in the upper surface has a flat surface; and a semiconductor laminate disposed on the upper surface of the substrate and on the edge pattern and having a plurality of uneven portions on at least one side surface thereof connected to the edge pattern, the plurality of uneven portions irregularly extending from the edge pattern in a stacking direction of the semiconductor laminate, wherein the semiconductor laminate has an AlN base layer, a first conductivity-type AlGaN semiconductor layer, an active layer having an AlGaN quantum well, and a second conductivity-type AlGaN semiconductor layer that are sequentially grown on the upper surface of the substrate.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
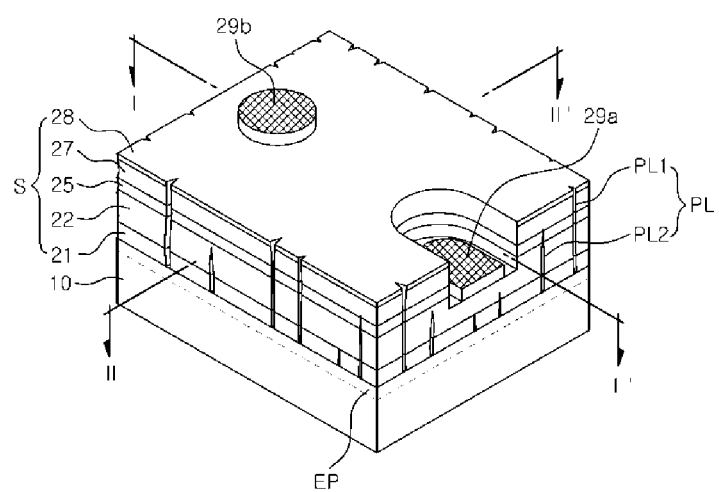
FIG. 1 is a schematic perspective view of an ultraviolet light emitting device according to an example embodiment.
Figure 2A:
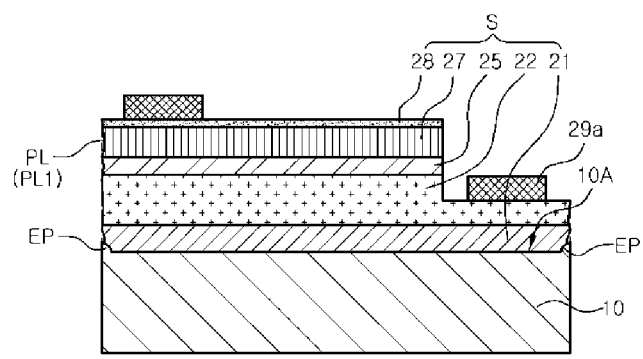
FIG. 2a and FIG. 2b are side cross-sectional views of the ultraviolet light emitting device shown in FIG. 1, taken along lines I-I' and II-II', respectively.
Figure 2B:
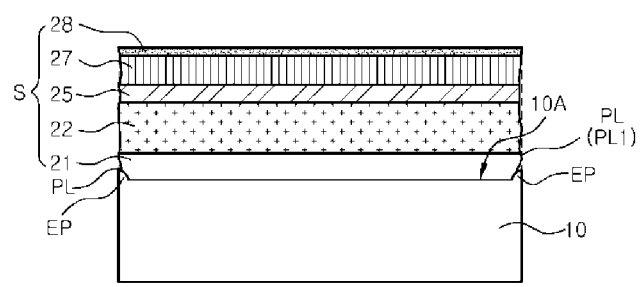

FIG. 1 is a schematic perspective view of an ultraviolet light emitting device such as a light emitting diode (LED), according to an example embodiment. FIG. 2a and FIG. 2b are side cross-sectional views of the ultraviolet light emitting device shown in FIG. 1, taken along lines I-I' and II-II', respectively.

Referring to FIG. 2a and FIG. 2b together with FIG. 1, an ultraviolet light emitting device 20 according to the embodiment includes a substrate 10 and a semiconductor laminate S disposed on the substrate 10 and configured to emit ultraviolet light. The semiconductor laminate S includes first and second conductivity-type semiconductor layers 22 and 27 and an active layer 25 disposed between the first and second conductivity-type semiconductor layers 22 and 27.

The substrate 10 may be an insulating, conductive or semiconductive substrate as a growth substrate for the semiconductor laminate S. For example, the substrate 10 may be sapphire, AlN, SiC, $MgAl_2O_4$, MgO, $LiAlO_2$, or $LiGaO_2$. An upper surface 10A of the substrate 10 is provided with an edge pattern EP arranged along edges thereof. The edge pattern EP employed in this embodiment may be a pattern having a convex curved surface. Further, the edge pattern EP may be a continuous pattern formed along the edges. Here, the term 'continuous pattern' refers to a continuously connected pattern, unlike a discontinuous pattern in which a plurality of patterns (e.g., dots), are arranged. The edge pattern EP may have the same shape on all side edges of the top surface of the substrate.

An inner region excluding the edges in the upper surface 10A of the substrate 10 has a flat surface. The edge pattern EP employed in the substrate 10 scatters light at an interface with the semiconductor laminate S, thereby improving light extraction efficiency.

A plurality of uneven portions PL provided on side surfaces of the semiconductor laminate S may be formed. In some embodiments, the uneven portions PL extend from the edge pattern EP along the side surfaces of the semiconductor laminate S in a stacking direction of the semiconductor laminate S. The uneven portions PL may contact the edge pattern EP and extend upward from the point of contact with the edge pattern EP. A plurality of even portions, such as flat side surfaces, may be formed between the plurality of uneven portions, such that the plurality of uneven portions form cleavages in the flat side surfaces.

The uneven portions PL employed in this embodiment may be spontaneously formed by the edge pattern EP. Specifically, since a lateral growth rate of the semiconductor laminate S (particularly, an AlN or AlGaN semiconductor portion) is relatively slow, the semiconductor laminate S may not be merged well on the edge pattern EP under normal growth conditions, and multiple defects may occur. These defects may propagate in a growth direction (that is, the stacking direction) during a growth process of the semiconductor laminate S, and may be provided as the uneven portions on the side surfaces of the semiconductor laminate S cut in a cutting process using chip separation (for example, laser scribing) (See FIGS. 7 to 11). For example, prior to cutting, these defects may include interfaces or irregularities in crystalline structure that show up as uneven alignment or irregular crystalline arrangement. During cutting, this uneven alignment may cause removal of some material from the cut surfaces, resulting in cracks, cleavages, gaps, or fissures, described generally herein as uneven portions. These uneven portions PL1 and PL2 may be used as elements for effectively extracting ultraviolet light generated from the active layer 25 through the side surfaces of the semiconductor laminate S to the outside.

Since the plurality of uneven portions PL are formed from crystal defects starting from the edge pattern EP, they may have irregular, non-uniform shapes and arrangements as a portion of such crystal defects. For example, their shapes and arrangements may be different from regular formations at side surfaces of semiconductor laminates that may occur where an edge pattern EP is not used.

As schematically shown in FIG. 1, the plurality of uneven portions PL have shapes of lines extending in the stacking direction, and the line shapes may be non-uniform. Further, the plurality of uneven portions PL may be arranged at irregular intervals. A width of each of the uneven portions PL may be changed without being constant, that is, without regularity. In addition, a direction in which each of the uneven portions PL extends may proceed substantially in the stacking direction rather than exactly in a vertical direction, but may also be changed irregularly.

One portion PL1 (e.g., one crack, gap, or fissure) of the plurality of uneven portions extends to an upper surface of the semiconductor laminate S, and another portion PL2 (e.g., another crack, gap, or fissure) of the plurality of uneven portions does not extend to the upper surface of the semiconductor laminate S and may be interrupted midway and thus, have a relatively short length.

As described above, the plurality of uneven portions PL start from the edge pattern EP but do not have regularity, and the respective uneven portions PL may be formed to have different shapes, intervals, and/or lengths. On the other hand, as in the embodiment shown in FIGS. 1, 2A, and 2B, the edge pattern EP may be formed in a pattern having regularity.

As mentioned above, the uneven portions PL may be described as cracks, gaps, cleavages, or fissures, with respect to the remainder of the semiconductor laminate S, and they may comprise regions where the materials of the semiconductor laminate S are not formed. They may be filled with an insulative material, such as air, or in some cases an encapsulating material that covers the entire LED chip. Air, as described herein is not limited to atmospheric air, and may include gases present during manufacturing processes. These regions where the materials of the semiconductor laminate S are not formed may have shapes that propagate from an edge pattern at the upper surface of the substrate 10, and continue either to a top surface of the semiconductor laminate S or to a point in the middle of the semiconductor laminate S, above which point the crack, gap, or fissure is not formed and there is no missing material from the semiconductor laminate S. The cracks, gaps, or fissures can be regions where the semiconductor laminate S has outer side surfaces exposed to an outside of the semiconductor laminate S and that have a different crystalline surface orientation from outer side surfaces of the semiconductor laminate S that do not include the cracks, gaps, or fissures. For example, an even surface of the semiconductor laminate S (where cracks, gaps, or fissures are not formed) may have a first crystal orientation, while the uneven surfaces (e.g., surfaces where the cracks, gaps, or fissures are formed) have a different crystal orientation.

The semiconductor laminate S employed in the embodiment may include a base layer 21 formed directly on an upper surface 10A of the substrate 10 as a buffer layer for growing a high quality AlGaN semiconductor. For example, the base layer 21 may be formed of a nitride such as AlN or AlGaN. The first conductivity-type semiconductor layer 22 may be an n-type nitride semiconductor represented by $Al_{x1}Ga_{1-x1}N$ (0<x1≤1), and an n-type impurity may be Si. For example, the first conductivity-type semiconductor layer 22 may include n-type AlGaN. The second conductivity-type semiconductor layer 27 may be a p-type nitride semiconductor represented by $Al_{x2}Ga_{1-x2}N$ (0<x2≤1), and a p-type impurity may be Mg. For example, the second conductivity-type semiconductor layer 27 may include p-type AlGaN. In one example, Al composition ratios x1 and x2 of the first and second conductivity-type semiconductor layers 22 and 27 may be in the range of 0.55 to 0.70 and further in the range of 0.60 to 0.65.

The active layer 25 employed in the embodiment may have a quantum well formed of $Al_{x3}Ga_{1-x3}N$ (0<x3<1). The active layer 25 may be a single quantum well (SQW) structure having a single quantum well, but is not limited thereto. The active layer 25 may have a multiple quantum well (MQW) structure in which a plurality of quantum well layers formed of $Al_{xa}Ga_{1-xa}N$ (0<xa<1) and a plurality of quantum barrier layers formed of $Al_{xb}Ga_{1-xb}N$ (xa<xb<1) are alternately stacked.

The quantum well of the active layer 25 has a band gap that determines a wavelength of ultraviolet light, and the active layer 25 employed in this embodiment may be configured to emit light having a wavelength of 210 to 315 nm. The first and second conductivity-type semiconductor layers 22 and 27 have a band gap wider than the band gap of the quantum well so that ultraviolet light generated from the active layer 25 is not absorbed therein. For example, an Al composition ratio x3 or xa of the quantum well may be smaller than the Al composition ratios x1 and x2 of the first and second conductivity-type semiconductor layers 22 and 27. In one example, the Al composition ratio x3 or xa of the quantum well may range from 0.35 to 0.5.

When the second conductivity-type semiconductor layer 27 is made of p-type AlGaN, it is difficult to form an ohmic-contact with a normal electrode material. Therefore, the semiconductor laminate S employed in the embodiment may include a second conductivity-type contact layer 28 formed on the second conductivity-type semiconductor layer 27 and having a relatively low band gap. An Al composition ratio of the second conductivity-type contact layer 28 is smaller than the Al composition ratio x2 of the second conductivity-type semiconductor layer 27 and may include, for example, p-type GaN.

The ultraviolet light emitting device 10 according to the embodiment shown in FIGS. 1, 2A, and 2B includes first and second electrodes 29a and 29b connected to the first and second conductivity-type semiconductor layers 22 and 27, respectively.

As shown in FIGS. 1 and 2a, the semiconductor laminate S has an area exposing one region of the first conductivity-type semiconductor layer 22 by partially removing the second conductivity-type semiconductor layer 27 and the active layer 25. The first electrode 29a may be disposed on the exposed region of the first conductivity-type semiconductor layer 22. For example, the first and second electrodes 29a and 29b may be formed of Al, Ti, Ni, Cr, Au, Ag or ITO or may be a multilayer structure configured of a composition thereof. For example, the first electrode 29a may include Ti/Al/Ni/Au, and the second electrode 29b may include Ag or Ni/Au.

The edge pattern EP employed in this embodiment not only improves light extraction efficiency by scattering light at an interface with the semiconductor laminate S but also provides defects that form the uneven portions PL disposed on the side surfaces of the semiconductor laminate S. Since the uneven portions PL are provided on the side surfaces of the semiconductor laminate S, they may be used as elements for effectively extracting ultraviolet light, outwardly. Light efficiency of the ultraviolet light emitting device 10 may be greatly improved.

In this embodiment, it is illustrated that the substrate 10 has a rectangular parallelepiped structure and the edge pattern EP is formed over all of four edges. In another embodiment, the edge pattern may be formed on only a portion of the edges. In this case, the uneven portions may be formed only on a side surface of the semiconductor laminate connected to the edge pattern.

The edge pattern employed in this embodiment is illustrated as a continuous pattern having convex portions, such as convex-curved surfaces, but it is not limited thereto, and in other embodiments, it may have a different shape, a concave pattern, or a discontinuous pattern (See, e.g., FIGS. 5a to 6b). The convex portions or other shaped portions of the edge pattern may include crossing lines, for example, that are regularly spaced apart from each other according to a particular pitch.

Figure 3:
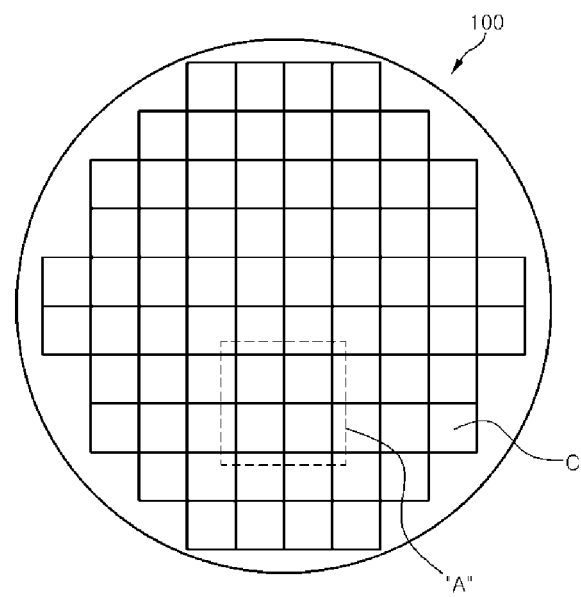
FIG. 3 is a plan view showing a wafer for manufacturing an ultraviolet light emitting device.

Referring to FIG. 3, a wafer for manufacturing an ultraviolet light emitting device is shown. The wafer provides a substrate for a plurality of ultraviolet light emitting devices, and substrate regions corresponding to individual ultraviolet light emitting devices are divided and marked with "C".

The wafer employed in the embodiment may have various types of edge patterns formed along boundaries of the individual substrate regions C. Various types of edge patterns are illustrated in FIG. 4 and FIGS. 5A to 6B, and each of the drawings shows an area corresponding to A portion of FIG. 3.

Figure 4:
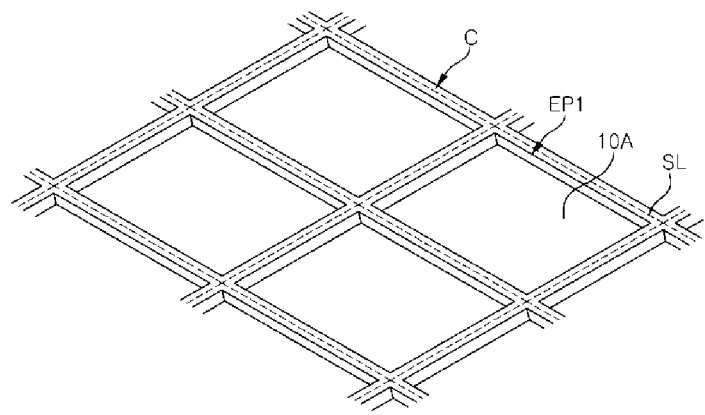
FIG. 4 is a perspective view showing an example of an edge pattern employable in an example embodiment.

Referring to FIG. 4, an edge pattern EP1 formed along boundaries of the substrate region C of each device may have a convex shape with a quadrangular cross-section, and is formed continuously along the edges. Alternatively, the cross-section may be curved. This edge pattern EP1 may not be a pattern obtained by directly processing a wafer to be used as a substrate but may be a pattern made of an amorphous dielectric material. For example, the amorphous dielectric material may include at least one selected from the group consisting of $SiO_2$, SiN, $TiO_2$, HfO and $MgF_2$. As described above, the convex pattern may be formed of an amorphous dielectric. An inner region surrounded by the edge pattern EP1 in the upper surface 10A of the substrate has a flat surface, and in the inner region that occupies a main area, the semiconductor laminate is normally grown. This flat surface may be, for example, a surface of a crystalline substrate, such as the wafer. On the other hand, a portion of the semiconductor laminate grown on the edge pattern EP1 has defects and provides uneven portions on a side surface of the semiconductor laminate at the time of cutting in the subsequent process. The devices cut from the wafer may be semiconductor chips. Here, dotted lines indicate a cutting line SL for an individual device (e.g., semiconductor chip, also described as a light emitting diode chip, or LED chip), and the substrate of the individual device has the edge pattern EP1 divided along the cutting line SL. It should be noted that terms such as "flat," "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially flat," may be exactly the same, equal, or flat, or may be the same, equal, or flat within acceptable variations that may occur, for example, due to uncontrollable manufacturing processes.

Figure 5A:
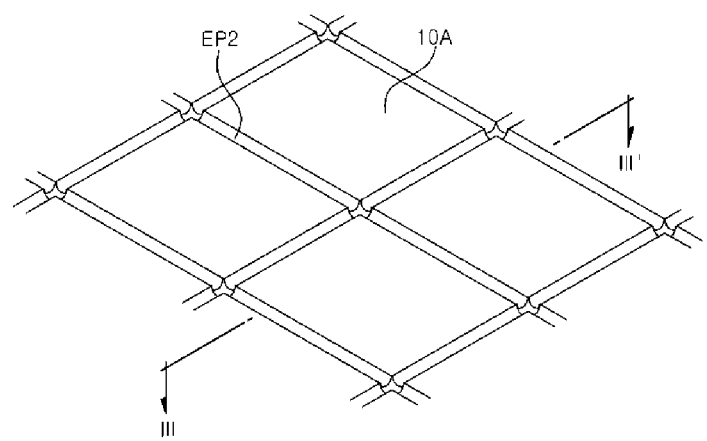
FIG. 5a and FIG. 5b are a perspective view and a cross-sectional view, respectively showing an example of an edge pattern employable in an example embodiment.
Figure 5B:
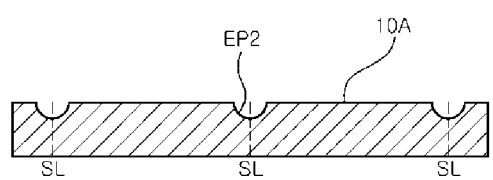

Referring to FIGS. 5a and 5b, in certain embodiments, an edge pattern EP2 formed along the boundaries of the substrate region C of each device has a curved, concave cross-sectional shape, and such a concave pattern may be formed continuously along the edges. The curved shape may be circular (or semi-circular), but can have other shapes as well. In addition, an inner region surrounded by the edge pattern EP2 in the upper surface 10A of the substrate has a flat surface, and in this inner region, the semiconductor laminate is normally grown. On the other hand, a portion of the semiconductor laminate grown on the concave edge pattern EP2 also has defects and provides uneven portions on a side surface of the semiconductor laminate after it is cut. The substrate of the individual device (e.g., a semiconductor chip that forms an LED) has the edge pattern EP2 divided along the cutting line SL, i.e., a pattern chamfered to be a curved surface.

Figure 6A:
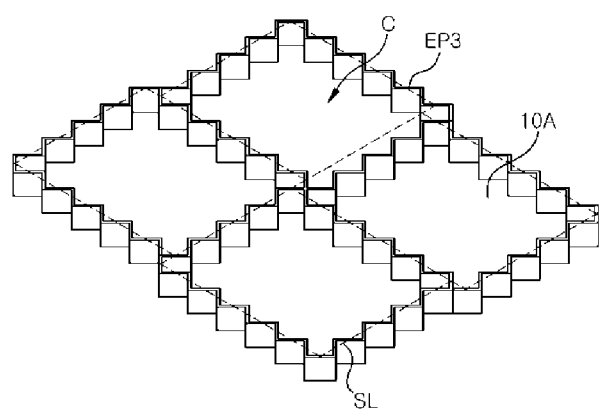
FIG. 6a and FIG. 6b are a perspective view and a plan view, respectively, showing an example of an edge pattern employable in an example embodiment.
Figure 6B:
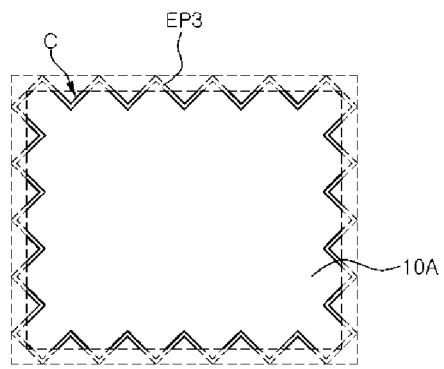

Referring to FIGS. 6a and 6b, an edge pattern EP3 formed along boundaries of the substrate region C of each device has a convex pattern formed in zigzag manner. Also in the case of the zigzag-shaped edge pattern EP3, an inner region surrounded by the edge pattern EP3 in the upper surface 10A of the substrate has a flat surface, and in this inner region, the semiconductor laminate is normally grown. On the other hand, a portion of the semiconductor laminate grown on the edge pattern EP3 also has defects and is formed as zigzag-shaped edge pattern, so that the defects are also located in zigzag manner corresponding to the edge pattern. Because of the edge pattern having such a shape, the cut side surface of the semiconductor laminate is provided not only with an irregular surface of the uneven portions but is also provided with an inclined surface between the uneven portions, so that light extraction may be further improved. Further, as shown in FIG. 6b, the substrate of the individual device may have a discontinuous edge pattern EP3 which is bent in the same direction after cutting, unlike the previous embodiments.

FIGS. 7 to 11 are process cross-sectional views illustrating a method of manufacturing an ultraviolet light-emitting device according to an example embodiment.

Figure 7:
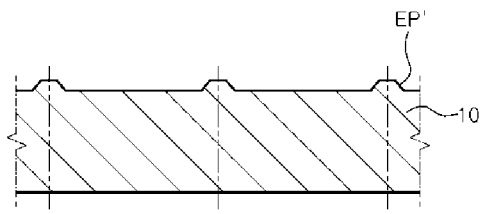
FIGS. 7 to 11 are process cross-sectional views illustrating a method of manufacturing an ultraviolet light-emitting device according to an example embodiment.

First, referring to FIG. 7, an edge pattern EP' is formed on a boundary (dotted line) between devices on the upper surface of the substrate 10 to be used as a growth substrate.

The edge pattern EP' employed in this embodiment has a convex shape with a trapezoidal cross-section. This edge pattern EP' may be formed continuously or discontinuously along edges. In this embodiment, the edge pattern EP1 is illustrated as a pattern obtained by directly processing a wafer to be used as the substrate 10. For example, it may be formed of the same material as the substrate in a crystalline form, and may be formed by selective epitaxial growth (e.g., wherein the flat surface regions of the substrate are covered by a mask that is later removed), or by etching parts of the substrate to form the regions between the edge portions (e.g., wherein a mask may be used to cover the edge pattern EP1 regions during etching). However, forming the pattern is not limited thereto, and the edge pattern EP' may be formed, for example, of an amorphous dielectric material. For example, the amorphous dielectric material may include at least one selected from the group consisting of $SiO_2$, SiN, $TiO_2$, HfO and $MgF_2$. The amorphous dielectric material may be deposited onto the substrate 10 in a processing step, such as a layer deposition process with patterning.

A region excluding the edge pattern EP' (e.g., between lines of the edge pattern) in the upper surface of the substrate 10 has a flat surface and in that region, the semiconductor laminate may be normally grown. However, the edge pattern EP' may interrupt semiconductor growth and thus, a portion of the semiconductor laminate positioned in the region where the edge pattern EP' is formed may have defects.

Figure 8:
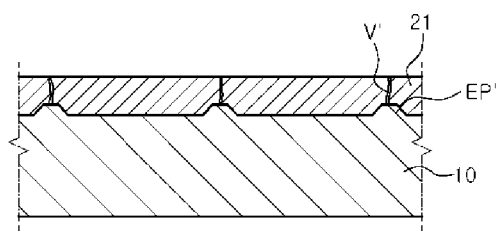

Next, referring to FIG. 8, a base layer 21 made of AlN or AlGaN may be formed as a buffer layer on the substrate 10.

The substrate 10 may be formed of sapphire or AlN. The base layer 21 may be grown using MOCVD (Metal Organic Chemical Vapor Deposition), HVPE (Hydride Vapor Phase Epitaxy), or MBE (Molecular Beam Epitaxy).

The base layer 21 grows as a crystal having relatively high quality on the flat surface excluding the edge pattern EP' on the upper surface of the substrate 10, whereas a region thereof positioned on the edge pattern EP' has a defect V' occurring therein since the edge pattern EP' interrupts semiconductor growth. As described above, since a lateral growth rate of the AlN or AlGaN semiconductor constituting the base layer 21 is relatively slow, the semiconductor may not be merged well on the edge pattern EP' and many defects may occur. Therefore, by including the edge pattern, defects V' are purposefully introduced to the semiconductor laminate on the wafer. These defects may be referred to as intentional defects. In this manner, defects may be intentionally formed on the edge pattern EP', while no defects are intentionally formed on the flat surface of the substrate between the edge patterns EP'. As a result, a number and size of defects formed on the edge patterns EP' may be greater than the number and size of defects formed on the flat surface of the substrate between the edge patterns EP'.

Figure 9:
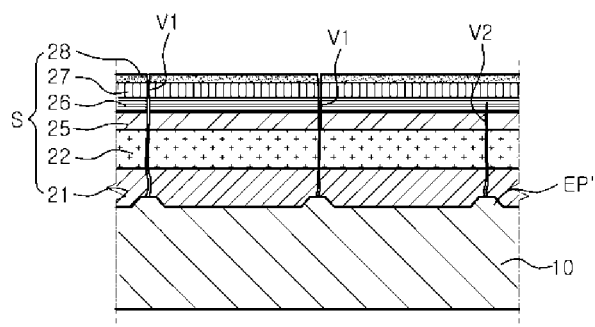

Next, referring to FIG. 9, a semiconductor laminate S for emission of ultraviolet light may be formed on the base layer 21.

The semiconductor laminate S includes the first conductivity-type semiconductor layer 22, the active layer 25, the electron blocking layer 26, the second conductivity-type semiconductor layer 27, and the second conductive contact layer 28, together with the base layer 21. The semiconductor laminate S may be grown, for example, using a MOCVD, HVPE or MBE process.

In this growth process, defects V' formed in the base layer (21) may propagate in a growth direction. A portion V1 of the propagated defects may extend to the upper surface of the semiconductor laminate S and another portion V2 of the propagated defects may be interrupted in the middle of the semiconductor laminate S. As described above, the defects V1 and V2 formed in the semiconductor laminate S may have various lengths and may formed to have irregular shapes and arrangements along the edge patterns EP'. These defects may be intentional defects, and may result in intentional cracks, gaps, or fissures in the semiconductor laminate S.

Unlike the previous embodiment (FIG. 1), the semiconductor laminate S according to this embodiment may further include the electron blocking layer (EBL). The electron blocking layer 26 is disposed between the second conductivity-type semiconductor layer 27 and the active layer 25 and has a band gap higher than that of the second conductivity-type semiconductor layer 27. For example, the electron blocking layer 26 may be a p-type nitride semiconductor represented by $Al_{x4}Ga_{1-x4}N$ ($x2<x4\leq1$). In one example, the Al composition ratio X4 of the electron blocking layer may be 0.8 or more. However, the same process described in FIGS. 7-11 (minus formation of the electron blocking layer 26) may be used to form the LED chip of FIG. 1.

Figure 10:
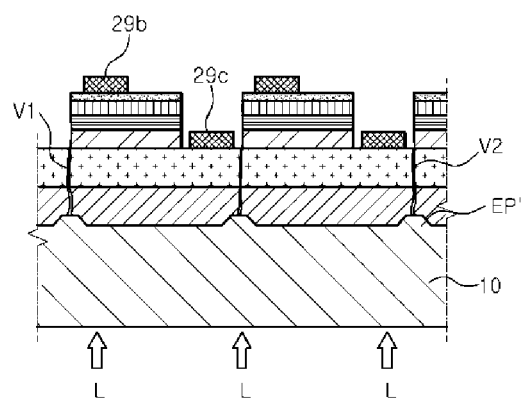

Referring to FIG. 10, the first and second electrodes 29a and 29b connected to the first and second conductivity-type semiconductor layers 22 and 27, respectively, may be formed.

In this embodiment, mesa etching may be performed on the semiconductor laminate S so that the first conductivity-type semiconductor layer 22 is partially exposed. For example, the second conductivity-type semiconductor layer 27 and the active layer may be partially etched to expose a portion of the first conductivity-type semiconductor layer 22. The process may be performed, for example, using a reactive ion etching (RIE) process.

The first and second electrodes 29a and 29b may include a single layer selected from Ag, Al, Ni, Cr, Pd, Cu, Pt, Sn, W, Au, Rh, Ir, Ru, Mg, Zn, and an alloy thereof, or a multiple layer formed of any combination of these elements. In some embodiments, the first electrode 29a may include Ti/Al/Ni/Au and the second electrode 29b may include Ag or Ni/Au.

Next, a process of separating the substrate 10 into the ultraviolet light emitting devices 10A along the edge pattern EP' is performed.

Figure 11:
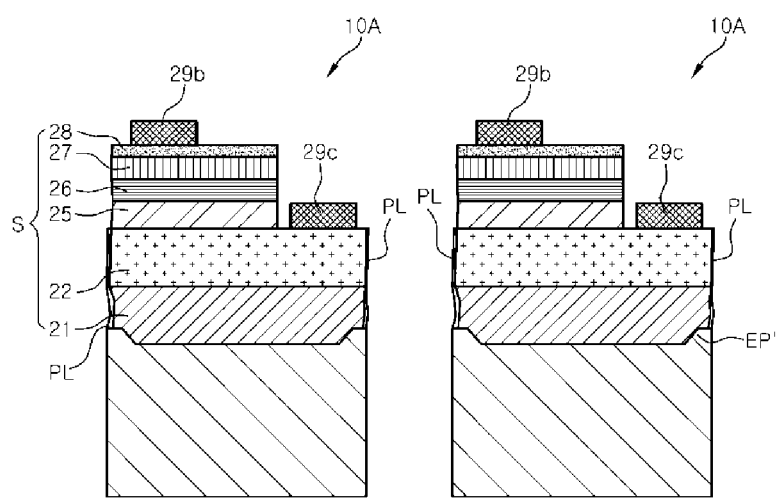

This device separation process may be performed, for example, using laser scribing. A laser beam L is scribed along a device separation region (a region corresponding to the edge pattern EP') on a bottom surface of the substrate 10, and the semiconductor laminate S may be broken in units of devices and as a result, may be separated into individual devices 10A as shown in FIG. 11.

The defects V1 and V2 located on the edge patterns EP' form cleavage surfaces in the process of cutting the semiconductor laminate into chips, and the cleavage surfaces are provided as side surfaces of the semiconductor laminate S of each device 10A. The cleavage surfaces are also described as cracks, gaps, or fissures in the side surfaces of the chips. As a result, the uneven portions PL (e.g., cracks, gaps, fissures, or cleavage surfaces) obtained from the defects V1 and V2 are provided on the side surfaces of the semiconductor laminate S, and the uneven portions PL may be used as elements for effectively extracting ultraviolet light generated from the active layer 25 through the side surface of the semiconductor laminate S to the outside.

As described above, in the ultraviolet light emitting device according to the embodiment, light at an interface with the semiconductor laminate may be effectively extracted by introducing the edge pattern of the growth substrate. By using this edge pattern, uneven portions may be intentionally formed on the side surface of the semiconductor laminate. For example, during the growth of the semiconductor laminate, a number of defects occur in the region on the edge pattern, and after the semiconductor laminate is cut into chips, the uneven portions are spontaneously formed on the side surface of the semiconductor laminate. These uneven portions may be formed at a higher density along the side surfaces of the chips as compared to a chip that does not include the edge patterns EP'. For example, by including the edge patterns EP', the overall surface area of each side surface of an LED chip may be at least 5% higher, or at least 10% higher than the surface area of each side surface of an LED chip that does not include the edge patterns EP' wherein the entire top surface of the substrate below the semiconductor laminate is substantially flat. In example embodiments, the overall surface area of the cleavages in one or more of the side surfaces may be a certain percentage of the overall surface area of the flat portions of those side surfaces (e.g., at least 10%, or at least 20%, and in some cases at least 50%). The intentionally formed gaps in the semiconductor laminate at the side surface of the semiconductor laminate may have tapering shapes toward the top surface of the semiconductor laminate. These cleavages, gaps, or uneven portions may significantly improve light efficiency of the ultraviolet light emitting device.

While example embodiments have been shown and described above, it will be apparent to those skilled in the art that modifications and variations could be made without departing from the scope of the present invention as defined by the appended claims.

What is claimed is:

1. An ultraviolet light emitting device comprising:
   a substrate provided with an edge pattern at an upper surface thereof at side edges of the substrate, the edge pattern having a concave or convex shape with respect to the upper surface of the substrate;
   a semiconductor laminate disposed on the substrate and on the edge pattern and including first and second conductivity-type AlGaN semiconductor layers and an active layer disposed between the first and second conductivity-type AlGaN semiconductor layers and having an AlGaN semiconductor;
   a plurality of uneven portions extending from the edge pattern along side surfaces of the semiconductor laminate in a stacking direction of the semiconductor laminate;
   first and second electrodes connected to the first and second conductivity-type AlGaN semiconductor layers, respectively; and
   a plurality of even portions between the plurality of uneven portions, the plurality of even portions comprising flat side surfaces, and the plurality of uneven portions comprising cleavages in the flat side surfaces,
   wherein the plurality of uneven portions are a plurality of gaps in the semiconductor laminate that start at the edge pattern along the side surfaces of the semiconductor laminate.

2. The ultraviolet light emitting device of claim 1, wherein as a result of the plurality of gaps, the side surfaces of the semiconductor laminate have a greater surface area than if the edge pattern were not used and the upper surface throughout the substrate were substantially flat.

3. The ultraviolet light emitting device of claim 1, wherein each inner region between portions of the edge pattern in the upper surface of the substrate has a flat surface.

4. The ultraviolet light emitting device of claim 1, wherein the edge pattern includes a plurality of convex portions regularly spaced apart at a first pitch.

5. The ultraviolet light emitting device of claim 1, wherein the edge pattern is formed on four side edges of the substrate and has a pattern extending continuously along each side edge.

6. The ultraviolet light emitting device of claim 1, wherein the plurality of uneven portions have shapes of non-uniform lines.

7. The ultraviolet light emitting device of claim 1, wherein the plurality of uneven portions are arranged at non-uniform intervals.

8. The ultraviolet light emitting device of claim 1, wherein a width of each of the plurality of uneven portions and a direction in which each of the plurality of uneven portions extends are non-uniformly changed in the stacking direction.

9. The ultraviolet light emitting device of claim 1, wherein at least a portion of the plurality of uneven portions extends to the upper surface of the semiconductor laminate.

10. The ultraviolet light emitting device of claim 1, wherein the semiconductor laminate further includes a second conductivity-type contact layer having an energy band gap smaller than an energy band gap of the second conductivity-type AlGaN semiconductor layer on the second conductivity-type AlGaN semiconductor layer.

11. An ultraviolet light emitting device, comprising:
  a substrate provided with a concave or convex edge pattern at side edges of an upper surface thereof, wherein an inner region excluding the side edges in the upper surface has a flat surface;
  a semiconductor laminate including a first conductivity-type AlGaN semiconductor layer, an active layer having an AlGaN quantum well, and a second conductivity-type AlGaN semiconductor layer that are sequentially disposed on the upper surface of the substrate and on the edge pattern; and
  a plurality of cleavages extending from the edge pattern along a side surface of the semiconductor laminate in a stacking direction of the semiconductor laminate and having shapes of non-uniform lines.

12. The ultraviolet light emitting device of claim 11, wherein the edge pattern has the same shape on all side edges of the upper surface of the substrate.

13. The ultraviolet light emitting device of claim 12, wherein the edge pattern includes a convex portion formed of an amorphous dielectric material.

14. The ultraviolet light emitting device of claim 11, wherein the plurality of cleavages have different lengths and are arranged at non-uniform intervals.

15. The ultraviolet light emitting device of claim 11, wherein at least a portion of the plurality of cleavages does not extend to an upper surface of the semiconductor laminate.

16. The ultraviolet light emitting device of claim 15, wherein a width of each of the plurality of cleavages and a direction in which each of the plurality of cleavages extends are irregularly changed in the stacking direction.

17. The ultraviolet light emitting device of claim 11, wherein the semiconductor laminate further includes an AlN base layer disposed on the upper surface of the substrate.

18. An ultraviolet light emitting device, comprising:
  a substrate having a rectangular parallelepiped structure and provided with an edge pattern disposed at at least one side edge of an upper surface thereof, wherein a region excluding the edge pattern in the upper surface has a flat surface; and
  a semiconductor laminate disposed on the upper surface of the substrate and on the edge pattern and having a plurality of gaps on at least one side surface of the semiconductor laminate and connected to the edge pattern, the plurality of gaps extending in non-uniform manner from the edge pattern in a stacking direction of the semiconductor laminate,
  wherein the semiconductor laminate has an AlN base layer, a first conductivity-type AlGaN semiconductor layer, an active layer having an AlGaN quantum well, and a second conductivity-type AlGaN semiconductor layer that are sequentially grown on the upper surface of the substrate.

19. The ultraviolet light emitting device of claim 18, wherein at least a portion of the plurality of gaps does not extend to an upper surface of the semiconductor laminate.

20. The ultraviolet light emitting device of claim 18, wherein a width of each of the plurality of gaps and a direction in which each of the plurality of gaps extends are irregularly changed in a direction perpendicular to the upper surface of the substrate.

* * * * *